United States Patent [19]

Inoue

[11] Patent Number: 4,845,539
[45] Date of Patent: Jul. 4, 1989

[54] SEMICONDUCTOR MEMORY DEVICE

[75] Inventor: Yasukazu Inoue, Tokyo, Japan

[73] Assignee: NEC Corporation, Tokyo, Japan

[21] Appl. No.: 275,621

[22] Filed: Nov. 15, 1988

Related U.S. Application Data

[63] Continuation of Ser. No. 813,303, Dec. 24, 1985, abandoned.

[30] Foreign Application Priority Data

Dec. 24, 1984 [JP] Japan .................................. 59-278012

[51] Int. Cl.$^4$ .................... H01L 29/78; H01L 27/02; H01L 27/04
[52] U.S. Cl. ............................. 357/23.6; 357/23.1; 357/23.4; 357/23.11; 357/41; 357/51; 357/55; 357/59
[58] Field of Search .................... 357/23.6, 23.4, 23.1, 357/41, 55, 59 E, 59 G, 59 J, 59 R, 23.11, 51

[56] References Cited

U.S. PATENT DOCUMENTS 4,630,237 12/1986 Miura et al. ...................... 357/41
4,651,184 3/1987 Malhi ................................ 357/23.6
4,672,410 6/1987 Miura et al. ...................... 357/23.6

FOREIGN PATENT DOCUMENTS 59-141262 8/1984 Japan .................................. 357/23.6

OTHER PUBLICATIONS

Chang et al., "Vertical FET Random-Access Memories With Deep Trench Isolation", IBM Technical Disclosure Bulletin, vol. 22, No. 8B, Jan. 1980.
IEEE Report, San Francisco Meeting-Dec. 1982, IEDM 82, pp. 786-787 and 806-808.

Primary Examiner—Andrew J. James
Assistant Examiner—Ngan van Ngo
Attorney, Agent, or Firm—Sughrue, Mion, Zinn, Macpeak & Seas

[57] ABSTRACT

A highly integrated semiconductor memory device having one transistor type memory cells is disclosed. The capacitor and transistor of the memory cell is provided within and around one trench formed in the semiconductor substrate. The channel region of the transistor is positioned along the side wall of the trench with a ring shape in the plan view and the capacitor element is surrounded by the transistor within the trench.

5 Claims, 4 Drawing Sheets

SEMICONDUCTOR MEMORY DEVICE

This is a continuation of application Ser. No. 06/813,303 filed Dec. 24, 1985, now abandoned.

BACKGROUND OF THE INVENTION

The present invention relates to a semiconductor memory device, and more particularly to a semiconductor memory device having a plurality of one-transistor type memory cells.

One-transistor type memory cell consisting of one insulated gate field effect transistor (hereinafter abbreviated as IGFET) and one capacitor has been widely used in a dynamic random access memory device such as 256K bits devices or 1 M bits devices under development. To realize a high integration, various attempts have been conducted in the memory cells. For example, a memory cell in which the IGFET is formed on a major surface of the semiconductor substrate by a conventional manner and the capacitor is formed in a trench provided in the substrate was proposed by H. Sunami, et al. in an article "A CORRUGATED CAPACITOR CELL (CCC) FOR MEGABIT MOS MEMORIES", International Electron Devices Meeting, Dec. 15, 1982, Session 26. The proposed memory cell contributes to a high integration to some extent because the capacitor per se is formed in the trench. However, reduction in size of the IGFET is impossible because it is formed on the major surface of the substrate. Namely, the channel length must be 1.0 $\mu$m or more to avoid a short channel effect, and each of source and drain regions formed on the major surface of the substrate must have a length of at least 3 $\mu$m for forming contact portion at its upper surface. Further, the distance between a trench of one memory cell and a trench of an adjacent memory cell cannot be made small for preventing punch-through phenomenon of depletion layers which are spread from trenches of capacitor elements. In the surface portion, the punch-through can be prevented by a channel stopper region formed under a field insulating layer. However, from the deeper portion of the trench, the depletion layer of the capacitor element extends freely into the substrate. Therefore, in the prior art, if the depth of the trench becomes deeper to obtain a large capacitance in the memory cell, the distance must be made larger. Thus, the prior art has a limitation in providing a highly integrated memory device.

SUMMARY OF THE INVENTION

Accordingly, one object of the present invention is to provide a highly integrated memory device in which the size of the IGFET and the distance between trenches are decreased.

According to one feature of the present invention, there is provided a semiconductor memory device comprising a plurality of memory cells arranged in a semiconductor substrate, each of the memory cells having an IGFET and a capacitor element coupled with the IGFET, the IGFET including a channel region provided along a side wall of a trench formed in the substrate, and the capacitor element including a dielectric film formed in the trench. The side wall of the trench, or the shape of the channel region of the IGFET may be substantially perpendicular to a major surface of the substrate, and the dielectric film may extend substantially in parallel with the side wall.

According to another feature of the present invention, there is provided a semiconductor memory device comprising a semiconductor substrate of one conductivity type having a major surface, a plurality of trenches formed in the substrate and extending from the major surface inward the substrate, and a plurality of memory cells each having one IGFET and one capacitor element coupled with the IGFET, the IGFET including a first impurity region of the opposite conductivity type formed in the major surface of the substrate and surrounding the trench, a second impurity region of the opposite conductivity type formed in the bottom of the trench, a gate insulating film formed on the side wall of the trench between the first and second impurity regions, a gate electrode made of, for example, polycrystalline silicon formed on the gate insulating film within the trench, and a channel region positioned in the side wall of the trench between the first and second impurity regions, the capacitor element including a first electrode made of, for example, polycrystalline silicon formed on the gate electrode by interposing an insulating layer within the trench and connected to the second impurity region, a dielectric film formed on the first electrode within the trench, and a second electrode made of, for example, polycrystalline silicon formed on the dielectric film within the trench. Further, a third impurity region of the one conductivity type and having a higher impurity concentration than that of the substrate may be provided under the second impurity region and extended to a part of the channel region. The each figures of the channel region, the gate insulating film, the gate electrode, the first electrode and the dielectric film may be a ring shape in the plan view. The second electrode of the capacitor element may be connected to a bit line, and the gate electrode of the IGFET may be connected to a word line. Or else, the first impurity region of the IGFET may be connected to a bit line, and the gate electrode of the IGFET may be connected to a word line.

DETAILED DESCRIPTION OF EMBODIMENTS

Figure 1:
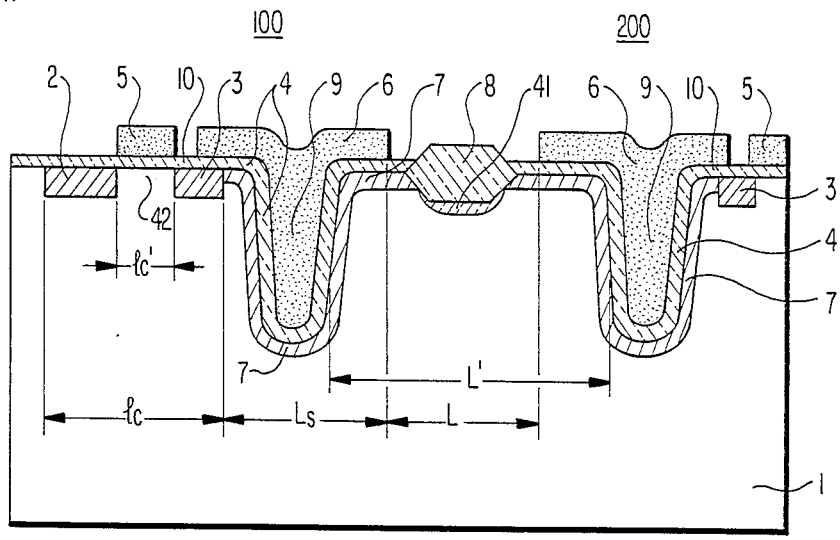
FIG. 1 is a cross-sectional view showing a memory device in the prior art.

Prior Art:

Referring to FIG. 1, memory cells 100, 200 of the prior art are separated by a thick insulating layer 8 and a P+-type channel stopper region 41 under the insulating layer, each other. Each of memory cells comprises one IGFET formed on a major surface of a P-type silicon substrate 1 and one capacitor element formed in a trench 9 provided in the substrate from the major surface inwardly. The IGFET includes N+-type source and drain regions 2, 3, a channel region 42, a gate insulating film 10 of silicon dioxide and a gate electrode 5 of polycrystalline silicon. The capacitor element includes a dielectric film 4 of silicon dioxide provided on a surface of the trench and formed continuously with the gate insulating film, an upper electrode 6 of polycrystalline silicon formed on the dielectric film 4 and filling the trench, and an N-type inversion layer 7 connected to one region 3 of the source and drain and formed in the substrate along the trench and under the dielectric film 4. The inversion layer is employed as a lower electrode of the capacitor element. The capacitor element per se can be designed in a small area, that is, small length $L_s$ because the most part of the element is formed in the trench. However, the IGFET cannot be reduced its area, that is, its length $l_c$ because, in the practical case, the channel length $l'_c$ must be kept 1.0 μm or more to avoid short channel effect, and the N+-type region 2 necessitates its length of 3 μm or more for forming the contact portion. Further, the distance L between the capacitor element of the memory cell 100 and that of the adjacent memory cell 200 cannot be reduced because the distance L' between trenches 9 cannot be voluntarily changed. Namely, if the distance L' would be designed to be short, a punch trough phenomenon would be caused by depletion layers which spread from PN junctions of the N-type inversion layers 7 of the capacitor elements and the P-type substrate.

Therefore, the memory device using the trench technology in the prior art can be reduced only the capacitor length $L_s$, but cannot be reduced transistor length $l_c$ and the distance L' between trenches.

First Embodiment of the Present Invention

Figure 2A:
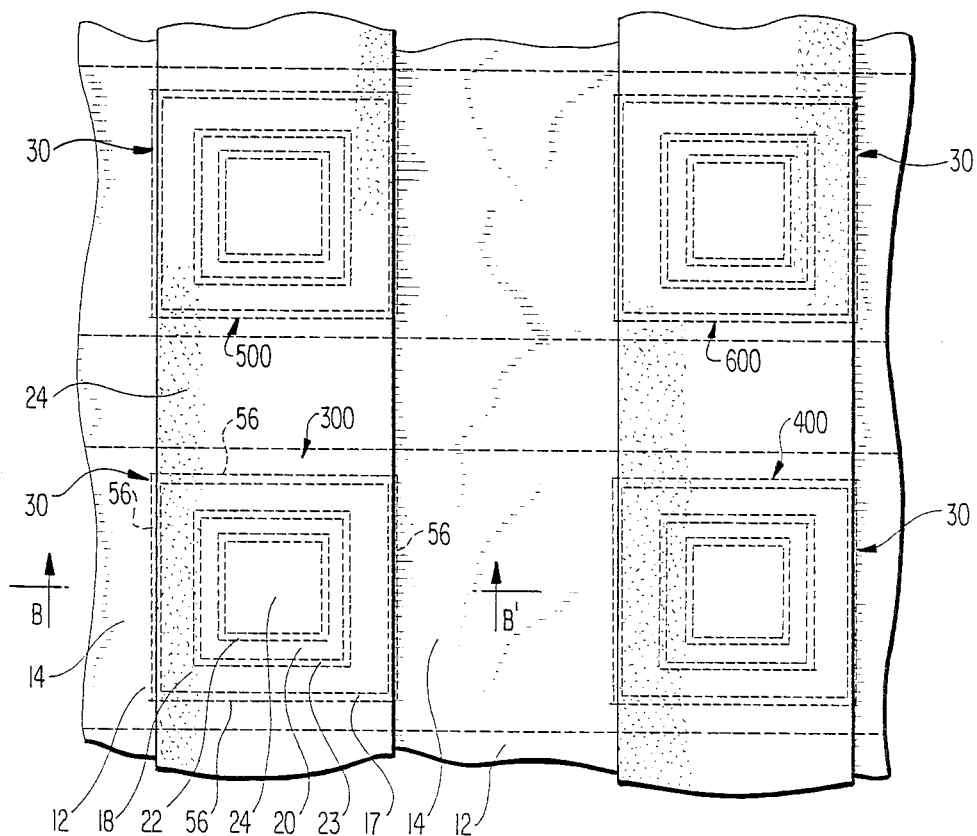
FIG. 2A is a plan view showing a first embodiment of the present invention.
Figure 2B:
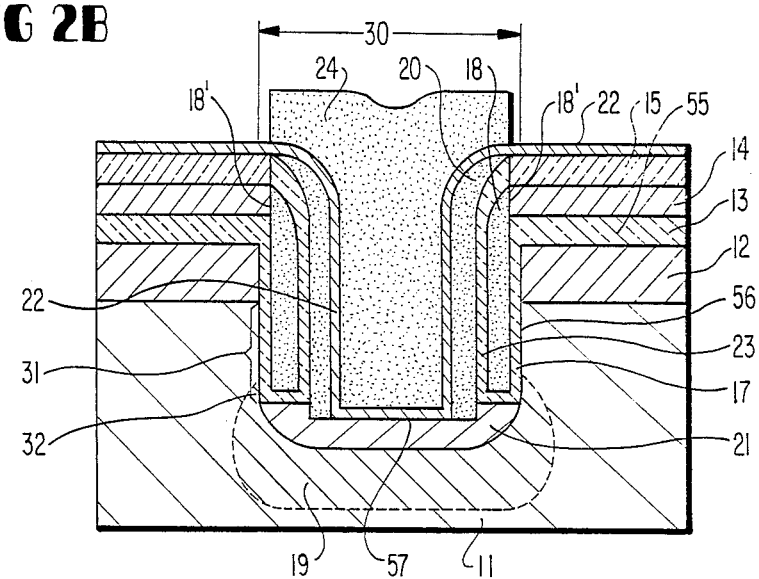
FIG. 2B is a cross-sectional view taken along line B-B' in FIG. 2A as viewed in the direction of arrows.
Figure 3:
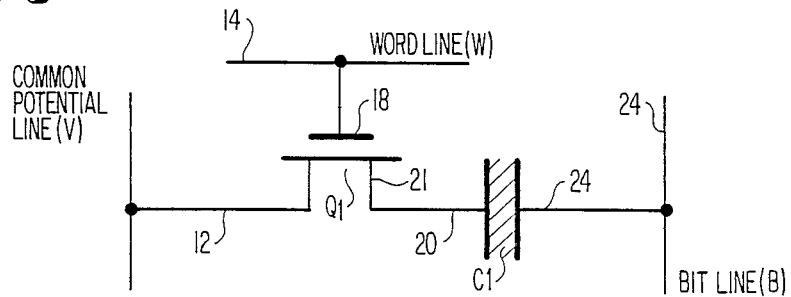
FIG. 3 shows an equivalent circuit diagram of the first embodiment of the present invention.

Referring to FIGS. 2A, 2B and 3, a plurality of trenches 30 having 2.5 μm□ square shape in the plan view are provided in a P-type silicon substrate 11 of $10^{15}$ atoms/cm$^3$ impurity concentration, and an N+-type region 12 of $10^{19}$ atoms/cm$^3$ impurity concentration is entirely formed in the major surface 55 of the substrate except the trenches. The trench 30 has a side wall 56 which is substantially perpendicular to the major surface 55 and enclosed by four edge lines in the plan view, and a bottom 57. The region 12 is connected to a common potential line (V) (not shown in FIG. 2), and used as source or drain region of IGFET Q$_1$ in each memory cell. Therefore, the region 12 must surround each trench, but is not necessarily to be entirely formed on the substrate. On the substrate, a silicon dioxide layer 13 of 5000 Å thickness is formed, and a silicon dioxide film 17 of 500 Å is formed on the inner surface, that is, side wall 56 of each trench 30. The ring shaped silicon dioxide film 17 is used as a gate insulating film of the IGFET Q$_1$. A first polycrystalline layer 18 doped an impurity and having 2000 Å thickness is formed on the silicon dioxide film 17. The ring shaped first polycrystalline layer 18 is used as a gate electrode of the IGFET Q$_1$ and connected to a word line 14 at the upper portion 18'. The word line 14 made of anti-oxidation metal such as tungsten or molybdenum and having 5000 Å thickness surrounds an upper portion 18' of the gate electrode 18 of each memory cell and connects to the upper portions 18' at the four outer surface lines. The word line 14 extends in one direction, that is, lateral direction in FIG. 2A. On the first polycrystalline silicon layer 18, a silicon dioxide layer 23 of 2000 Å thickness is formed, and on the metal layer 14, a silicon dioxide layer 15 having 5000 Å thickness is formed. A second polycrystalline silicon layer 20 doped an impurity and having 3000 Å thickness is formed on the silicon dioxide layer 23. The ring shaped second silicon layer 20 is used as one electrode of the capacitor element C$_1$ of each memory cell and connected to an N+-type impurity region 21 of $10^{19}$ atoms/cm$^3$ impurity concentration which is formed at the entire bottom 57 of the trench 30 and used as drain or source region of the IGFET Q$_1$. The N+-type impurity region 21 is entirely surrounded by a P+-type impurity region 19 of $10^{16}$ to $10^{17}$ atoms/cm$^3$ impurity concentration, and therefore in the channel region 31 of the IGFET Q$_1$, an effective channel length is defined by the length of the region 32 overlapped by the high impurity region 19. On the second polycrystalline silicon layer 20, on the silicon dioxide layer 15 and on the exposed center portion of the N+-type impurity region 21, an insulating film 22 such as a silicon dioxide film or a silicon nitride film having 100 Å A to 200 Å thickness is continuously formed as a dielectric film of the capacitor element C$_1$. A third polycrystalline silicon layer 24 doped impurity is formed on the insulating film 22 within the trenches such that it fills trenches, and extends in a direction at right angles with the word line 14. The third silicon layer 24 is used as the other electrode of the capacitor element C$_1$ in each trench, that is, in each memory cell, and also used as a bit line of the memory device.

According to the embodiment of the present invention, the IGFET Q$_1$ is positioned in the trench with the capacitor element. Namely, each of memory cells 300 to 600 is provided in one trench. Further, the outside of the trench is surrounded by the ring shaped channel region 31 of the IGFET and the capacitor element is provided within the trench such that it is surrounded by the IGFET. Therefore, a trench can be provided near other trench without consideration of the punch through phenomenon in the prior art, and each trench can be freely deepened to obtain a necessary capacitance such as 50 to 70 f$_F$. Namely, memory cells 300 to 600 can be near provided each other within the accuracy of PR technology. Moreover, the P+-region 19 can be used as a barrier from α particles.

Figure 4A:
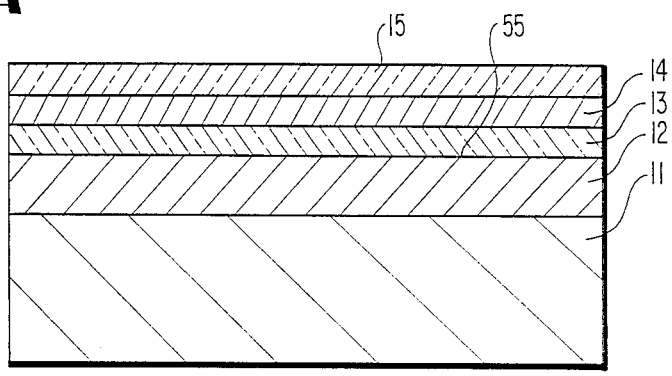
FIG. 4A to FIG. 4D are cross-sectional views showing process steps sequentially for manufacturing the embodiment of the present invention.

The memory device shown in FIGS. 2A, 2B and 3 is manufactured through the following process steps. As shown in FIG. 4A, the N+-type impurity region 12 is entirely or selectively formed on the major surface 55 of the P-type silicon substrate 11, and the silicon dioxide layer 13 is formed, thermally or chemical vapor deposition (CVD) method. The anti-oxidation metal layer 14 such as tungsten layer or molybdenum layer is deposited and patterned as shown in FIG. 2A, and the silicon dioxide layer 15 is entirely formed. Next, a plurality of trenches 30 as shown in FIG. 2A are formed in the substrate through layers 13, 14, 15.

Figure 4B:
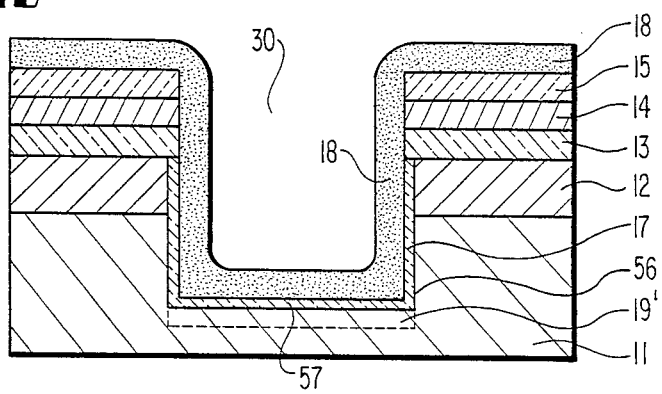
Figure 4C:
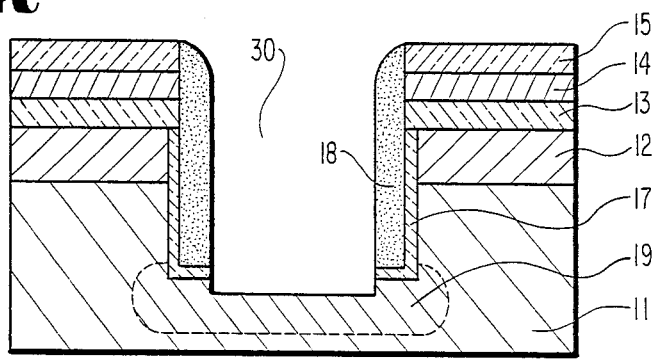

The thin silicon dioxide film 17 is thermally grown on the entire inner surface of the trench, and the P+-type impurity region 19' is formed at the bottom 57 of the trench by ion implantation method. Then, the first polycrystalline silicon layer 18 which is doped an impurity to be a conductive layer is entirely formed. In this case, the side surface of the metal layer 14 is exposed, and therefore, the first silicon layer 18 is connected to the side surface (FIG. 4B). Next, as shown in FIG. 4C, the P+-type region 19' is thermally extended to form the P+-type region 19. Then, the first silicon layer 18 is selectively removed by anisotropic etching such that the portion 18 which is formed on the side wall of the trench is only left. By the anisotropic etching, the P+-type region 19 is exposed at the bottom of the trench.

Figure 4D:
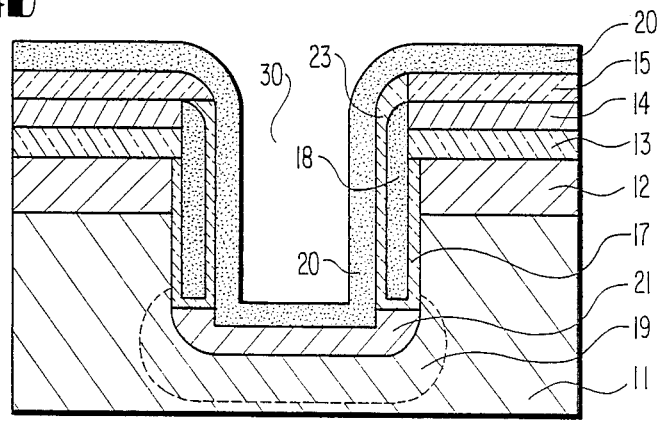

Next, by conducting a thermal treatment of low temperature such as 900° C. or less, the silicon dioxide layer 23 is grown on the remain first silicon layer 18. During the thermal treatment, a thin silicon oxide film is also formed on the exposed P+-type region 19. However, the thin silicon oxide film is removed by an anisotropic etching. Then, the second polycrystalline silicon layer 20 is entirely deposited. The second silicon layer 20 contains an N-type impurity, and by thermal treatment the N+-type impurity region 21 is formed by introducing the N-type impurity from the second silicon layer (FIG. 4D). Returning to FIGS. 2A and 2B, by conducting an anisotropic etching, the portion of the second silicon layer 20 on the silicon dioxide layer 23 only remains, and the other portions of the second silicon layer 20 in FIG. 4D are removed. Then, the thin insulating film 22 of $SiO_2$, $Si_3N_4$, $Ta_2O_5$ or $Al_2O_3$ is entirely formed by sputter method or CVD method. Next, the third polycrystalline silicon layer 24 which is doped an impurity to be a conductive layer is formed with a thickness which can fill the trench, and patterned to form the bit line.

Second Embodiment of the Present Invention

Figure 5:
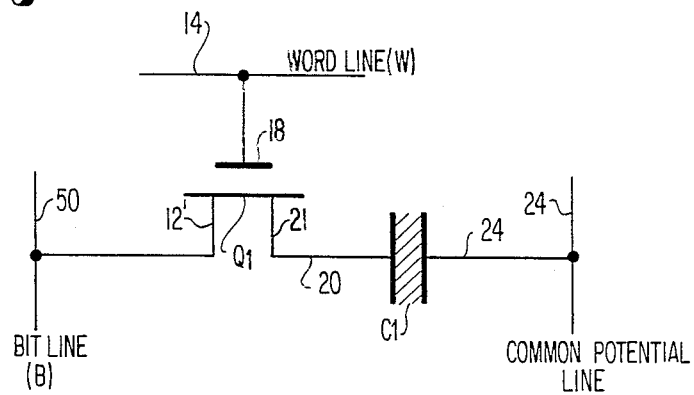
FIG. 5 shows an equivalent circuit diagram of a second embodiment of the present invention.
Figure 6:
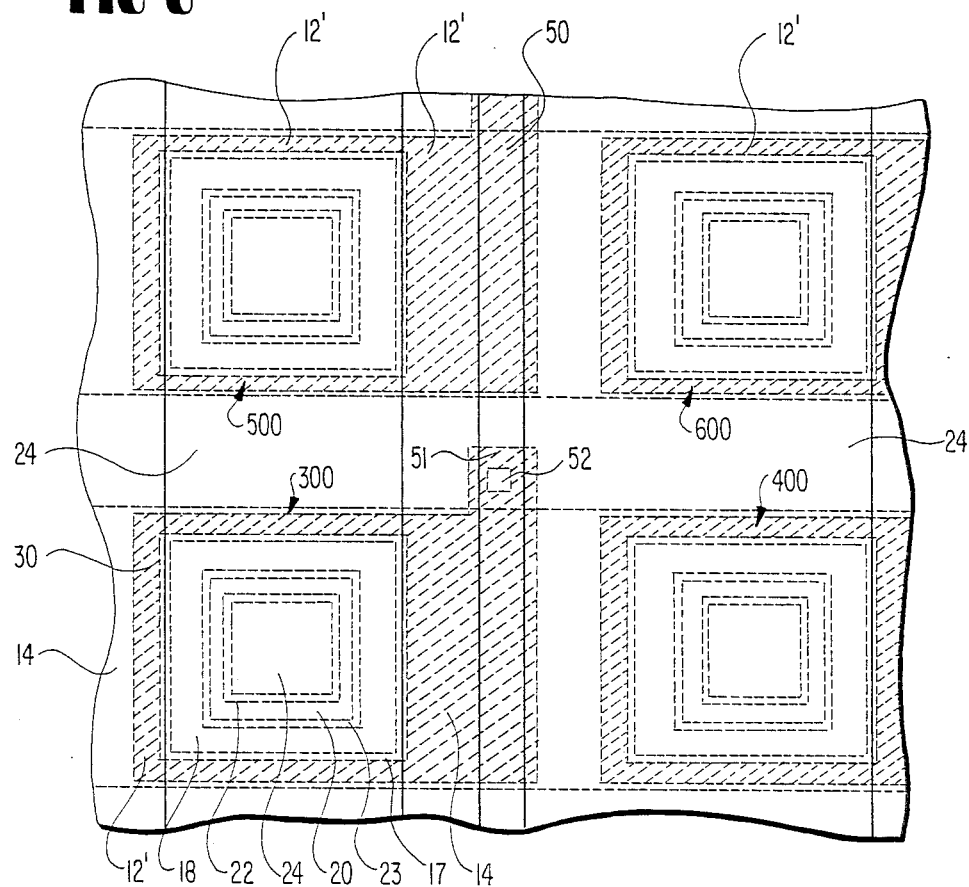
FIG. 6 is a plan view showing the second embodiment of the present invention.

Referring to FIGS. 5 and 6, in which elements like those of the first embodiment shown in FIGS. 2 to 4 have been identified with like numerals.

In the above mentioned first embodiment, the upper electrodes 24 of the third polycrystalline of the capacitor element are continuously formed with and connected to the bit line, and the N+-type impurity regions 12, that is, one of source and drain regions of the IGFET's are connected to the common potential line. Namely, a plurality of the N+-type impurity regions 12 of respective IGFET's are commonly connected each other, and applied a common potential.

However, in the second embodiment, the upper electrodes 24 of the third polycrystalline of the capacitor element are connected to the common potential line. Namely, all of the silicon layers 24 extending vertically in FIG. 6 are commonly connected (not shown) and applied thereto a common fixed potential. On the other hand, an N+-type impurity region 12', corresponding to the impurity region 12 of the first embodiment, formed on the major surface of the silicon substrate surrounds the trench and has an island-like shape in the plan view as indicated by the right-upward chain hatching in FIG. 6.

The N+-type impurity region 12' includes a contact portion 51, and a bit line 50 of aluminum is connected to the N+-type impurity region 12' at the contact portion 51 through a contact hole 52 provided in the insulating layers 13, 15, 22. The bit line 50 is connected to the impurity region 12' of the memory cell 300 and that of the memory cell 500 in common, and extends in a direction at right angles with the word line 14 in the plan view on the insulating layer 22. Also, a bit line (not shown) is connected to the impurity regions 12' of the memory cells 400, 600 and extends in the same direction as conventional memory device. The device of the second embodiment has the same advantages as that of the first embodiment.

In the first and second embodiments, the N channel type IGFET has been exemplified. However, the same effects can be expected even if a P channel type IGFET would be used in a memory cell.

What is claimed is:

1. A semiconductor memory device comprising a plurality of memory cells each having one insulated gate type field effect transistor and one MOS type capacitor element coupled to said transistor, a plurality of word lines each coupled to corresponding ones of said memory cells, a plurality of bit lines each coupled to corresponding ones of said memory cells, a semiconductor substrate of one conductivity type having a major surface, and a plurality of trenches formed in said substrate and extending from said major surface into said substrate each of said trenches having a bottom and a side wall consisting of an upper side wall and a lower side wall, said upper side wall abutting said major surface of said substrate and said lower side wall abutting said bottom, and said upper and lower side walls being substantially straight from said major surface of said substrate to said bottom of said trench, each of said transistors belonging to a respective one of said memory cells including a first impurity region of the opposite conductivity type serving as one of source and drain regions formed at said major surface of said substrate and surrounding said upper side wall of said trench such that said upper side wall of said trench is constituted by said first impurity region, a second impurity region of the opposite conductivity type serving as the other of the source and drain regions formed in said substrate at said bottom of said trench such that said bottom of said trench is constituted by said second impurity region, a channel region provided along said lower side wall of said trench between said first and second impurity regions and surrounding said trench, such that said channel region is substantially straight between said first and second impurity regions, a gate insulating film of a tubular shape formed on said channel region, a polycrystalline silicon layer of a tubular shape having lower and upper sections, said lower section being formed on said gate insulating film within said trench for serving as a gate electrode of said transistor and said upper section protruding from said trench at a level higher than said major surface of said substrate, said lower section having an outer surface contacting said gate insulating film and an inner surface, and said upper section having an outer surface overlapping said outer surface of said lower section in plan view and an inner surface, said word line being made of metal and surrounding, and contacting said outer surface of said upper section of said polycrystalline silicon layer each of said MOS type capacitor elements belonging to respective memory cells including a first electrode having a tubular shape formed on said inner surfaces of said lower and upper sections of said polycrystalline silicon layer with an insulating layer interposed therebetween within trench, said first electrode extending downwardly and being contacted to said second impurity region of said transistor at said bottom of said trench, a dielectric film having a tubular shape formed on said first electrode in said trench, and a second electrode formed on said dielectric film within said trench whereby said trench is completely bordered by said source and drain regions and said channel region of said transistor such that said trench is bordered by said transistor belonging to one memory cell, and said MOS type capacitor having said first and second electrodes and said dielectric film belong to said one memory is formed in said trench so as to be surrounded by said transistor.

2. A semiconductor memory device of claim 1 further comprising a third impurity region of said one conductivity type and having a higher impurity concentration than that of said substrate, said third impurity region being provided under said second impurity region and extended to a part of said channel region.

3. A semiconductor memory device of claim 1, in which said first impurity region is selectively formed, at said major surface of said substrate such that said first impurity region belonging to one memory cell is separated from said first impurity regions belonging to adjacent memory cells and said bit line is connected to said first impurity region at its contact portion located outside said word line in the plan view.

4. A semiconductor memory device of claim 1 in which said gate electrode, said first electrode and said second electrode are made of polycrystalline silicon, respectively.

5. A semiconductor memory device of claim 1, in which said second electrode of said capacitor element is connected to a bit line, and said gate electrode of said transistor is connected to a word line.

* * * * *

UNITED STATES PATENT AND TRADEMARK OFFICE
CERTIFICATE OF CORRECTION

PATENT NO. : 4,845,539

DATED : July 4, 1989

INVENTOR(S) : INOUE

It is certified that error appears in the above-identified patent and that said Letters Patent is hereby corrected as shown below:

Column 2, line 60, delete "100, 200" and insert --100, 200--;

Signed and Sealed this

Fifth Day of June, 1990

Attest:

HARRY F. MANBECK, JR.

*Attesting Officer*         *Commissioner of Patents and Trademarks*